(12) United States Patent
Rahman (10) Patent No.: US 7,189,491 B2
(45) Date of Patent: Mar. 13, 2007

(54) PHOTORESIST COMPOSITION FOR DEEP UV AND PROCESS THEREOF

(75) Inventor: M. Dalil Rahman, Flemington, NJ (US)

(73) Assignee: AZ Electronic Materials USA Corp., Sommerville, NJ (US)

( * ) Notice: Subject to any disclaimer, the term of this patent is extended or adjusted under 35 U.S.C. 154(b) by 0 days.

(21) Appl. No.: 10/734,022

(22) Filed: Dec. 11, 2003

(65) Prior Publication Data

US 2005/0130058 A1    Jun. 16, 2005

(51) Int. Cl.
G03F 7/004 (2006.01)
G03F 7/30 (2006.01)

(52) U.S. Cl. .................. 430/270.1; 430/326; 430/330; 430/905; 430/910

(58) Field of Classification Search ............. 430/270.1, 430/905, 910, 326, 330; 524/155, 376; 560/116, 560/128; 554/121
See application file for complete search history.

(56) References Cited

U.S. PATENT DOCUMENTS

| | | | |
|---|---|---|---|
| 4,491,628 A | 1/1985 | Ito et al. | |
| 5,350,660 A | 9/1994 | Urano et al. | |
| 5,843,624 A | 12/1998 | Houlihan et al. | |
| 6,274,286 B1 | 8/2001 | Hatakeyama et al. | |
| 6,447,980 B1 | 9/2002 | Rahman et al. | 430/270.1 |
| 6,531,627 B2 * | 3/2003 | Nishi et al. | 560/128 |
| 7,022,458 B2 * | 4/2006 | Lee et al. | 430/270.1 |
| 2002/0098440 A1 | 7/2002 | Sato et al. | 430/270.1 |
| 2003/0054286 A1 | 3/2003 | Sato et al. | 430/270.1 |
| 2003/0149225 A1 | 8/2003 | Okino et al. | 528/272 |
| 2003/0219680 A1 * | 11/2003 | Nishimura et al. | 430/270.1 |
| 2004/0063827 A1 * | 4/2004 | Nishiyama et al. | 524/155 |
| 2004/0087694 A1 * | 5/2004 | Nakao | 524/376 |
| 2004/0253538 A1 * | 12/2004 | Fujimori | 430/270.1 |

FOREIGN PATENT DOCUMENTS

EP    1 215 193 B1    11/2004
EP    1 505 439 A2    2/2005

OTHER PUBLICATIONS

Notification Concerning Transmittal of Copy of International Preliminary Report on Patentability (Chapter 1 of the Patent Cooperation Treaty) (Form PCT/IB/326); International Preliminary Report on Patentability (Form PCT/IB/373): and Written Opinion of the International Searching Authority (Form PCT/ISA/237) for PCT/IB2004/004386.

Notification of Transmittal of the International Search Report and the Written Opinion of the International Searching Authority, or the Declaration (Form PCT/ISA/220) along with the International Search Report (Form PCT/ISA/210) and Written Opinion of the International Searching Authority (Form PCT/ISA/237) for PCT/IB2004/004386.

Uetani et al., "Standard Developer Available ArF resist and Performance", SPIE vol. 3333, No. 1, pp. 546-553 (1998).

Nakano et al., Adhesion Characteristics of Alicyclic Polymers for use in ArF Excimer Laser Lithography, Proc. SPIE vol. 3333, pp. 43-pp. 52 (1998).

Wallow et al., "Reactive ion etching of 193 nm resist candidates: current platforms, future requirements", Proc. SPIE vol. 3333, pp. 92-pp. 101 (1998).

Jung et al., "Design of cycloolefin-maleic anhydride resist for ArF lithography", SPIE vol. 3333, pp. 11-pp. 25 (1998).

Nozaki et al., "A novel polymer for 193-nm resist", Journal of Photopolymer Science and Technology, vol. 9, No. 3, pp. 509-pp. 522 (1996).

Nozaki et al., "Evaluation of alicyclic Methacrylate Resist with a γ-Butyrolactone protective Group for 193-nm Lithography", Journal of Photopolymer Science and Technology, vol. 11, No. 3, pp. 493-pp. 498 (1998).

Tran et al., "Metal-Catalyzed Vinyl Addition Polymers for 157 nm Resist Applications. 2. Fluorinated Norbornenes: Synthesis, Polymerization, and Initial Imaging Results", Macromolecules, vol. 35, No. 17, pp. 6539-pp. 6549 (2002).

* cited by examiner

Primary Examiner—John S. Chu
(74) Attorney, Agent, or Firm—Sangya Jain (57) ABSTRACT

The present invention relates to a novel photoresist composition sensitive to radiation in the deep ultraviolet and a process for imaging the composition. The photoresist composition comprises a) a novel polymer that is insoluble in an aqueous alkaline solution and comprises at least one acid labile group, and b) a compound capable of producing an acid upon irradiation. The novel polymer of the present invention comprises at least one unit with a bisester group, (—C(O)OWC(O)O—), attached on one side to a polymer backbone unit (A) comprising an aliphatic group, and attached on the other side to an adamantyl group. The invention also relates to the novel polymer and a novel monomer for obtaining the novel polymer.

20 Claims, 3 Drawing Sheets where, in Figure 1, $R_1$-$R_7$ are independently H, F, $(C_1$-$C_8)$alkyl, $(C_1$-$C_8)$fluoroalkyl, substituted or unsubstituted hydrocarbyl group, etc., but at least one of $R_1$-$R_6$ has the pendant bisester-adamantyl functionality described in structure 1.

Figure 1:   Generic structures for the norbornene-based monomer $R_1$, $R_2$, $R_3$ are independently alkyl, fluoroalkyl, F, $OC_nH_{2n+1}$, $OC_nF_{2n+1}$, $CO_2$-tert-Bu, $OCH_2$-$CO_2$-tert-Bu n=1-4, $OCH_2OCH_3$ $X^-$ =Anion of non-nucleophlic strong acid eg $^-OSO_2C_nF_{2n+1}$; $AsF_6^-$, $SbF_6^-$, $^-N(SO_2C_nF_{2n+1})_2$; $^-C(SO_2C_nF_{2n+1})_3$ Figure 2: Examples of Photoactive Compounds Figure 3:   Examples of suitable ammonium bases.

PHOTORESIST COMPOSITION FOR DEEP UV AND PROCESS THEREOF

FIELD OF INVENTION

The present invention relates to a photoresist composition sensitive to radiation in the deep ultraviolet, particularly a positive working photoresist sensitive in the range of 100–300 nanometers (nm). The present invention also relates to a process for imaging the photoresist composition of this invention.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization. There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Photoresists sensitive to short wavelengths, between about 100 nm and about 300 nm can also be used where subhalfmicron geometries are required. Particularly preferred are photoresists comprising non-aromatic polymers, a photoacid generator, optionally a solubility inhibitor, and solvent.

High resolution, chemically amplified, deep ultraviolet (100–300 nm) positive and negative tone photoresists are available for patterning images with less than quarter micron geometries. Chemically amplified resists, in which a single photo generated proton catalytically cleaves several acid labile groups, are used in photolithography applicable to sub quarter-micron design rules. As a result of the catalytic reaction, the sensitivity of the resulting resist is quite high compared to the conventional novolak-diazonaphthoquinone resists. To date, there are three major deep ultraviolet (uv) exposure technologies that have provided significant advancement in miniaturization, and these are lasers that emit radiation at 248 nm, 193 nm and 157 nm. Examples of such photoresists are given in the following patents and incorporated herein by reference, U.S. Pat. No. 4,491,628, U.S. Pat. No. 5,350,660, and U.S. Pat. No. 5,843,624. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by the absence of aromatics.

Photoresists based on chemical amplification mechanism are employed for 248 and 193 nm applications. However, the photoresist materials applicable for 248 nm cannot be used at 193 nm due to the high absorption of the poly(4-hydroxystyrene) based polymers used for 248 nm applications. 193 nm applications typically require non-aromatic compounds. Open-chain aliphatic resins cannot be used due to the very high etch rates of these materials. Polymers possessing annelated structures in the side chains such as tricyclododecyl and adamantane or cycloolefins in the main chain are shown to provide etch resistance close to poly(4-hydroxystyrene) polymers [Nakano et al. Proc. SPIE 3333, 43 (1998), Nozaki et al., Wallow et al. Proc. SPIE 3333, 92 (1998), and J. C. Jung et al. Proc. SPIE 3333, 11, (1998)].

Houlihan et al (U.S. Pat. No. 5,843,624), disclose a polymer for photoresist application, which is a polymer made from a cyclic olefin, maleic anhydride and a substituted or unsubstituted acrylate.

Rahman et al (U.S. Pat. No. 6,447,980) discloses a polymer with a unit comprising a multicyclic backbone with a pendant bisester, however, the acid labile group is a t-butyl group.

The present invention relates to a chemically amplified system, which is sensitive to wavelengths between 300 nm and 100 nm, and comprises a) a novel polymer that is insoluble in an aqueous alkaline solution and comprises at least one acid labile group, and, b) a compound capable of producing an acid upon radiation. The novel polymer of the invention derived from a novel monomer, provides a photoresist with superior lithographic properties.

SUMMARY OF INVENTION

The present invention relates to a novel photoresist composition sensitive to radiation in the deep ultraviolet, particularly a positive working photoresist sensitive in the range of 100–300 nm. The photoresist composition comprises a) a novel polymer that is insoluble in an aqueous alkaline solution and comprises at least one acid labile group, and b) a compound capable of producing an acid upon irradiation. The novel polymer of the present invention comprises at least one unit with a bisester group (—C(O)OWC(O)O—) attached on one side to a polymer backbone unit (A) comprising an aliphatic group, and attached on the other side to an adamantyl group, as described by structure 1, (1)

where, A is a unit derived from an aliphatic unsaturated moiety, W is a nonaromatic linking group, R is independently selected from substituted or unsubstituted hydrocarbyl group, hydrogen, hydroxyl, and $(C_1-C_{10})$alkyl, R' is hydrogen or $(C_1-C_6)$alkyl, and n=1–9. Other monomeric units may be present in the polymer, which impart various desirable properties to the polymer.

The invention also relates to a process of imaging the novel positive photoresist composition.

The invention further relates to the novel polymer and a novel monomer used to make the polymer, where the monomer comprises an aliphatic unsaturated moiety with a pendant structure 2, (2)

where, W is a nonaromatic linking group, R is independently selected from substituted hydrocarbyl group, unsubstituted hydrocarbyl group, hydrogen, hydroxyl, and $(C_1-C_{10})$alkyl, R' is hydrogen or $(C_1-C_6)$alkyl, and n=1–9.

DETAIL DESCRIPTION OF THE INVENTION

The present invention relates to a novel chemically amplified photoresist, which is sensitive to wavelengths between 300 nm and 100 nm, and comprises a) a novel polymer that is insoluble in an aqueous alkaline solution and comprises at least one acid labile group, and b) a compound capable of producing an acid upon irradiation. The novel polymer of the present invention comprises at least one unit with a bisester group (—C(O)OWC(O)O—) attached on one side to a polymer backbone unit (A) comprising an aliphatic group, and attached on the other side to an adamantyl group, as described by structure 1, (1)

where, A is a unit derived from an aliphatic unsaturated moiety, W is a nonaromatic linking group, R is independently selected from substituted or unsubstituted hydrocarbyl group, hydrogen, hydroxyl, and $(C_1-C_{10})$alkyl, R' is hydrogen or $(C_1-C_6)$alkyl, and n=1–9. Other monomeric units may be present in the polymer which impart various desirable properties to the polymer. The present invention also relates to the novel polymer and the novel monomer which when polymerized gives the polymer of the present invention. The novel monomer comprises an aliphatic unsaturated moiety with a pendant structure 2, (2)

where, W is a nonaromatic linking group, R is independently selected from substituted hydrocarbyl group, unsubstituted hydrocarbyl group, hydrogen, hydroxyl, and $(C_1-C_{10})$alkyl, R' is hydrogen or $(C_1-C_6)$alkyl, and n=1–9.

The present invention further relates to a process for imaging the novel photoresist composition The polymer of the present invention is especially useful for photoresists, where the imaging wavelength is in the range 200 nm to 100 nm. In a preferred embodiment the polymer is essentially nonaromatic.

In the above definition and throughout the present specification, alkyl means linear and branched alkyl having the desirable number of carbon atoms and valence. Furthermore, alkyl also includes aliphatic cyclic groups, which may be monocyclic, bicyclic, tricyclic and so on. Suitable linear alkyl groups include methyl, ethyl, propyl, butyl, pentyl, etc.; branched alkyl groups include isopropyl, iso or tert butyl, branched pentyl, hexyl, octyl, etc; monocyclic alkyl groups include cyclopentyl, cyclohexyl and cycloheptyl; bicyclic alkyl groups include substituted bicyclo[2.2.1]heptane, bicyclo[2.2.1]octane, bicyclo [2.2.2]octane, bicyclo [3.2.1]octane, bicyclo[3.2.2]nonane, and bicyclo [3.3.2]decane, and the like. Examples of tricyclic alkyl groups include tricyclo[5.4.0.0.$^{2,9}$]undecane, tricyclo[4.2.1.2.$^{7,9}$]undecane, tricyclo[5.3.2.0.$^{4,9}$]dodecane, and tricyclo [5.2.1.0.$^{2,6}$]decane. As mentioned herein the cyclic alkyl groups may have any of the alkyl alkoxy, ester, hydroxyl or halo groups as substituents.

Other alkyl substituents or alkylene groups envisioned as being within the scope of this invention are divalent groups such as methylene, 1,1- or 1,2-ethylene, 1,1-, 1,2-, or 1,3 propylene and so on; a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above.

Fluoroalky groups may be linear or branched and can be represented by trifluoromethyl, 1,1,2-trifluoroethyl, pentafluoroethyl, perfluoropropyl, perfluorobutyl, and 1,1,2,3,3-pentafluorobutyl. Alkylspirocyclic or fluoroalkylspirocyclic are cyclic alkylene structures connected to the same carbon atom, preferably where the ring contains from 4 to 8 carbon atoms, and further where the ring may have substituents, such as F, alkyl, and fluoroalkyl. Alkoxy substituents can include methoxy, ethoxy, n-propoxy, isopropoxy, n-butoxy, isobutoxy, tert-butoxy, pentyloxy, hexyloxy, heptyloxy, octyloxy, nonyloxy, decanyloxy, 4-methylhexyloxy, 2-propylheptyloxy, 2-ethyloctyloxy, etc.

Hydrocarbyl groups are ones that contain atoms other than carbon and hydrogen but are predominantly hydrocarbon in nature, where examples of other atoms are sulfur, oxygen or nitrogen, which may be present alone (such as thia or ether) or as functional linkages such as ester, carboxy, carbonyl, etc. Substituted hydrocarbon groups, that is, substituents containing non-hydrocarbon groups which, in the context of this invention, do not alter the predominantly hydrocarbon substituent (e.g., halo (especially chloro and fluoro), hydroxy, alkoxy, mercapto, alkylmercapto, nitro, nitroso, and sulfoxy) may also be used. The carbon content generally ranges from 1 carbon to 10 carbon atoms.

The polymer of the present invention comprises at least one unit of structure 1. The backbone of the polymer, unit A in structure 1, is derived from an aliphatic unsaturated or olefinic monomer, which may be linear or cyclic. Examples of monomers that can form the polymeric backbone are substituted or unsubstituted unsaturated compounds, which may be cyclic or linear. The polymer backbone may be an substituted or unsubstituted ethylene chain derived from an unsaturated monomer, where the backbone unit is directly linked to the bisester group or may be linked through another linking aliphatic moiety, such as a 5 to 8 membered monocyclic group, 6 to 20 membered multicyclic group, aliphatic noncyclic group, or through an ester of a 5 to 8 membered monocyclic group, multicyclic group, aliphatic noncyclic group, or through an ether of a 5 to 8 membered monocyclic group, multicyclic group, aliphatic noncyclic group, etc. Examples of such linking aliphatic moieties attached to the ethylene backbone are substituted or unsubstituted cyclopentyl, cyclohexyl, norbornyl, X, C(O)OX, OX, where X is a 5 to 8 membered monocyclic group, 6 to 20 membered multicyclic group, aliphatic alkylene groups. In general, in one embodiment, the backbone polymeric unit A may have the structure 3, (3)

where $R_1'$, $R_1''$ and $R_1'''$ are independently hydrogen, ($C_1$–$C_6$)alkyl or cyano, and Y is X, —C(O)OX, —OX, where X is a 5 to 8 membered monocyclic group, 6 to 20 membered multicyclic group, aliphatic ($C_1$–$C_6$)alkylene group, and m is 0 or 1.

In some cases it is preferable that the polymeric backbone unit A is derived from a monomer comprising an unsaturated cycloaliphatic moiety, which may be monocyclic or multicyclic. Examples of monocyclic groups are 5 to 8 membered, substituted or unsubstituted, carbon rings, and examples of multicyclic rings are bicyclic groups including substituted bicyclo[2.2.1]heptane, bicyclo[2.2.1]octane, bicyclo [2.2.2]octane, bicyclo [3.2.1]octane, bicyclo [3.2.2] nonane, and bicyclo [3.3.2]decane, and the like. Examples of tricyclic alkyl groups include tricyclo[5.4.0.0.$^{2,9}$]undecane, tricyclo[4.2.1.2.$^{7,9}$]undecane, tricyclo[5.3.2.0.$^{4,9}$] dodecane, and tricyclo[5.2.1.0.$^{2,6}$]decane. Polymers containing multicyclic aliphatic rings are preferred in the polymer, especially for imaging at 193 nm, since these rings are more resistant to dry etching than monocyclic rings. Typically multicyclic groups are those derived from cyclo olefins, especially norbornene based monomers, and examples of such multicyclic monomers that may be used to form the polymer of the present invention are represented in FIG. 1.

Figure 1:
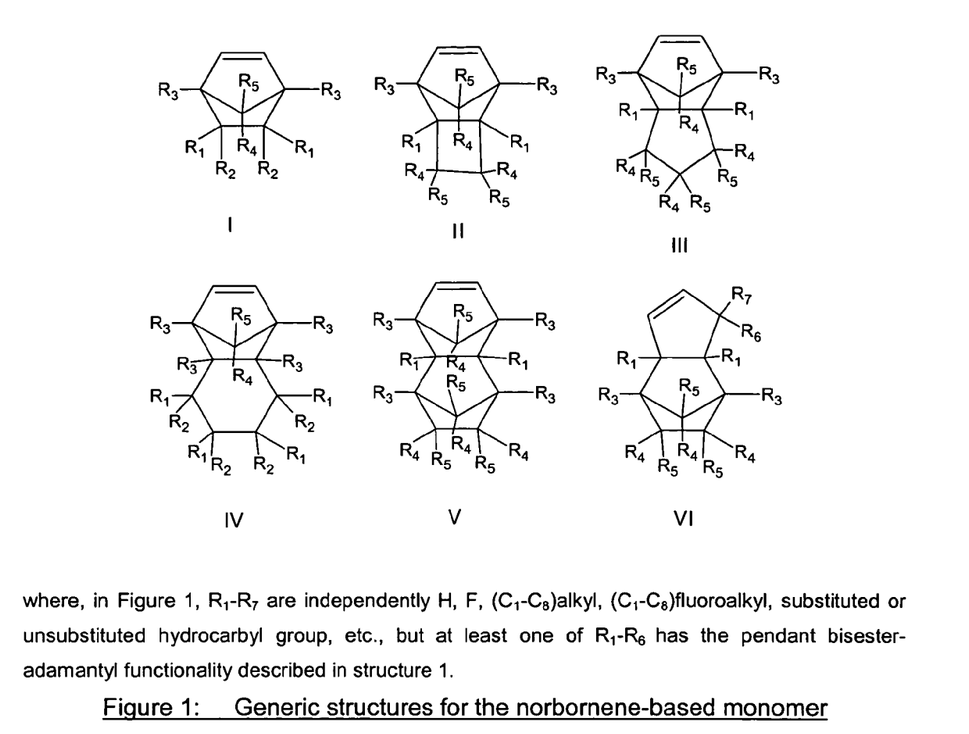
FIG. 1 illustrates the various examples of norbornene-base monomers to be used in the polymer of the invention.

The multicyclic unit of FIG. 1 is substituted such that within the polymer at least one unit has the pendant bisesteradamantyl functionality described in structure 1, but the cyclic group may also have other substituents. Typical substituents are H, F, alkyl, fluoroalkyl, cycloalkyl, fluorocycloalkyl, hydrocarbyl groups, and cyano. Additionally, as referred to within FIG. 1, $R_1$ and $R_2$ or $R_5$ and $R_4$ or $R_6$ and $R_7$ substituents may together be part of a spiroalkyl or fluorospiroalkyl subsituent.

The two ester groups that form part of the bisester group in structure 1, are connected through a group defined by W, which may be an alkyl group, such as ($C_1$–$C_8$) linear or branched alkyl, and substituted or unsubstituted cycloalkyl, Specific examples of W, but not limiting, are methylene, methyl methylene group, dimethyl methylene, ethylene, isopropylene, propylene, norbornene, bisnorbornene, etc.

In one embodiment of structure 1, more than one bisesteradamantyl functionality of structure 1 may be pendant from the comonomeric unit in the polymer backbone, that is, more than one bisester-adamantyl group may be pendant from A.

The adamantyl group attached to the bisester moiety is selected preferably to be acid labile, although if the adamantyl group is not acid labile, then one of the other comonomers may contain an acid labile group. Prior to exposure the polymer is insoluble or only very slightly soluble in the alkali developer. After exposure to radiation and in the presence of a photogenerated acid, the acid labile protecting group undergoes acidolysis or hydrolysis to form a free carboxylic acid, thereby making the polymer soluble in the alkali developer for a positive photoresist. The polymer may be capped with a protecting group after polymerization or the monomer(s) may be capped with a protecting group and then polymerized. Examples of the adamantyl groups are 2-methyl adamantyl, 2-ethyl adamantyl, 3-hydroxy adamantyl, 2-methyl-3-hydroxy adamantyl, 2-ethyl-3-hydroxy adamantyl,5-hydroxy-3,7-dimethyl adamantyl;3, 5-dihydroxy adamantyl and 5-hydroxymethyl adamantyl.

Examples of specific monomers that may be polymerized or copolymerized with other monomers, without limitation are shown in structures 4 and 5.

(4)

(5)

The polymer may further comprise monomeric units other than those described by structure 1. These may be any units that impart suitable properties to the polymers and the photoresist derived from them. Examples of other types of comonomers that may be used are without limitation, cyclic anhydrides, (meth)acrylate esters, vinyl acetals, cyclo olefins especially norbornene derivatives, etc. More specific examples of cyclic anhydrides are maleic anhydride and itaconic anhydride. Examples of vinyl acetals are acrolein diethyl acetal, acrolein dimethyl acetal, 2-vinyl-1,3-dioxalane, and acrolein ethylene acetal. Examples of acrylates and methacrylates are esters of acrylic and methacrylic acid, where the pendant group from the carboxylate is a substituted or unsubstituted cyclic lactones, substituted or unsubstituted adamantyl groups, acid labile groups, and the like. Acid labile groups may be acetal protecting groups such as methyoxymethyl or acid cleaveable alkoxycarbonyl (e.g. tert-butoxycarboxyl, t-BOC), alkyleneoxyalkyl groups, trialkylsilyl, 2-(trialkylsilyl)ethyl, specific examples of these acid labile groups are methyloxymethyl, adamantylmethyloxymethyl, bicyclohexyloxymethyl, ethyloxymethyl, menthyloxymethyl, and cyclopentyloxymethyl.

Polymers derived from the polymerization of substituted acrylates, substituted norbornenes, and cyclic anhydrides are one embodiment, where either the acrylate and/or the norbornene monomer has the structural unit 1. Specific examples of polymers are those comprising structure 1 and at least one monomeric unit derived from a monomer selected from maleic anhydride, vinyl lactones, norbornene derivatives and (meth)acrylates.

Any number of comonomers may be used to give the desired lithographic properties. Typical comonomers are described and incorporated by reference in U.S. Pat. No. 5,843,624 and U.S. Pat. No. 6,447,980, providing at least one unit of structure 1 is present in the polymer.

Examples of acrylate comonomer or comonomers used in the synthesis of the polymer are of the following structure 6, furthermore, acrylate as referred to in this application refers generally to alkyl substituted or unsubstituted monomers, such as methacrylate, ethacrylate, etc.:

(6)

where, $R_1'$ is a cyclic moeity, preferably a nonaromatic cyclic moeity and where, $R_2''$ in the above structures is hydrogen or $(C_1-C_4)$alkyl. Some specific structures for $R_2''$ are:

-continued

Some examples of the cyclo olefin comonomer are t-butyl norbornene carboxylate (BNC), hydroxyethyl norbornene carboxylate (HNC), norbornene carboxylic acid (NC), t-butyl tetracyclo[4.4.0.1.$^{2,6}$1.$^{7,10}$]dodec-8-ene-3-carboxylate, and t-butoxycarbonylmethyl tetracyclo[4.4.0.1.$^{2,6}$1.$^{7,10}$]dodec-8-ene-3-carboxylate.

The acrylate monomers may be exemplified by mevaloniclactone methacrylate (MLMA), 2-methyladamantyl methacrylate (MAdMA), isoadamantyl methacrylate, 3-hydroxy-1-methacryloxyadamatane, 3,5-dihydroxy-1-methacryloxyadamantane, β-methacryloxy-γ-butyrolactone, and α-methacryloxy-γ-butyrolactone.

Typically multicyclic monomers are polymerized with an active metal catalyst, a palladium or nickel complex, such as described in Hoang V. Tran et al Macromolecules 35 6539, 2002, and incorporated herein by reference. Acrylate polymers may be polymerized using free radical polymerization.

The polymers of this invention can be synthesized using techniques known in the art. The polymer of this invention, especially those that can be synthesized by free radical polymerization technique, may use for example, 2,2'-azobisisobutyronitrile (AIBN) as initiator. A mixture of monomers is added to a reaction vessel together with a solvent, e.g. tetrahydrofuran, and AIBN is added. The reaction is carried out at a suitable temperature for a suitable amount of time to give a polymer with desired properties. The reaction may also be carried out without a solvent. The temperature may range from about 35° C. to about 150° C., preferably 50° C. to 90° C. for about 5 to 25 hours. The reaction may be carried out at atmospheric pressure or at higher pressures. It has been found that a reaction carried out under a pressure of from about 48,000 Pascals to about 250,000 Pascals gives a polymer with more consistent properties, where examples of such desirable properties are molecular weight, dark film loss, yield, etc. Dark film loss is a measure of the solubility of the unexposed photoresist film in the developing solution, and a minimal film loss is preferred. The polymer may be isolated from any suitable solvent, such as, diethyl ether, hexane or mixture of both hexane and ether. Other polymerization techniques may be used to obtain a polymer with the desired chemical and physical properties.

The polymer may comprise the unit of structures at a level ranging from 5 mole % to 50 mole %, preferably 10 mole % to 40 mole %, and more preferably from 10 mole % to 30 mole %.

Transparency of the polymers in a photoresist is an important requirement. Thus, the absorption coefficient of the resin film is less than 4/micron at the exposure wavelength, typically 193 nm, preferably 3/micron and more preferably less than 2/micron and even more preferably less than 1/micron.

It is preferred if the polymers employed in such formulations have a weight average molecular weight from about 1,000 to about 200,000, preferably from about 4,000 to about 20,000, more preferably from about 6,000 to about 14,000.

The compound capable of producing an acid upon irradiation, a photoacid generator (PAG), of the novel composition is selected from those which absorb at the desired exposure wavelength, preferably 193 nm and 157 nm. Suitable examples of the acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide and their homologues are also possible candidates. Mixtures of photoactive compounds may also be used.

Figure 2:
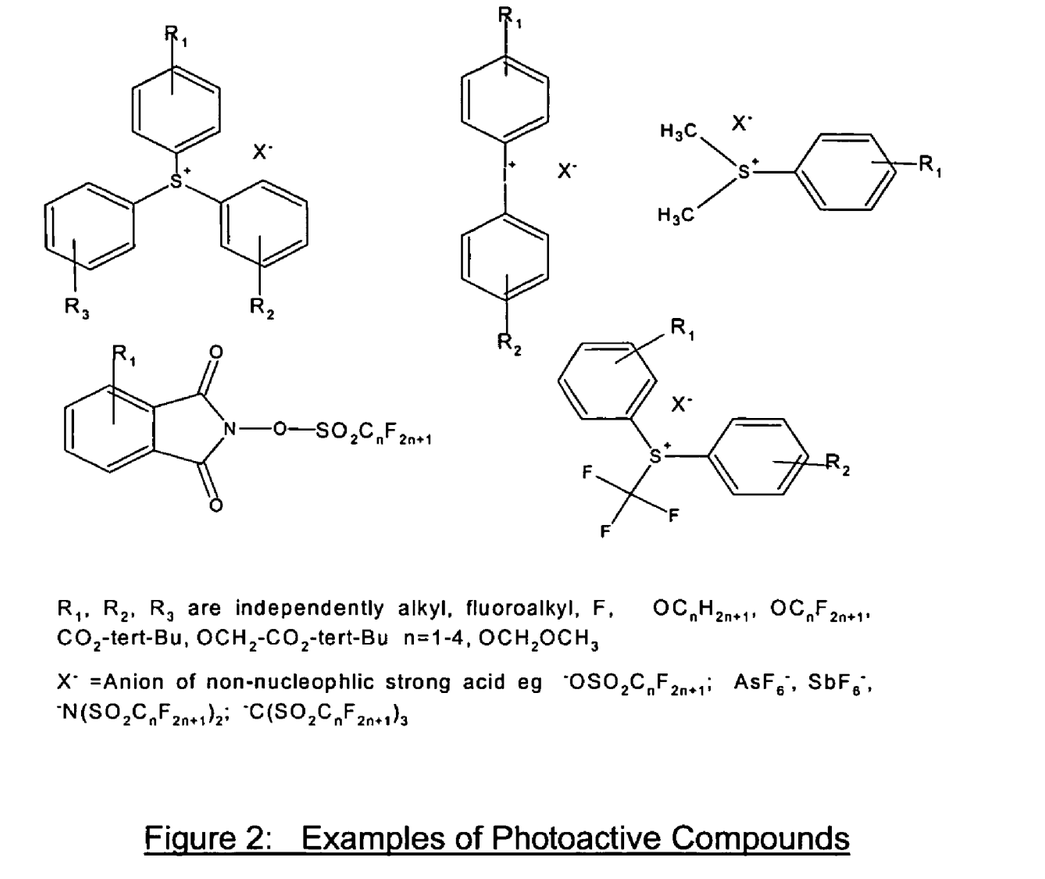
FIG. 2 illustrates some examples of photoactive compounds which can be used in the photoresist.

FIG. 2 shows examples of PAG structures, such as onium salts and hydroxyamic derivatives which are useful.

The photoresist of the present invention comprises the novel polymer, a photoacid generator, and optionally a base additive. In some cases bases or photoactive bases are added to the photoresist to control the profiles of the imaged photoresist and prevent surface inhibition effects, such as T-tops. Nitrogen containing bases are preferred, specific examples of which are amines, such as triethylamine, triethanolamine, aniline, ethylenediamine, pyridine, tetraalkylammonium hydroxide or its salts. Examples of photosensitive bases are diphenyliodonium hydroxide, dialkyliodonium hydroxide, trialkylsulfonium hydroxide, etc. The base may be added at levels up to 100 mole % relative to the photoacid generator. Although, the term base additive is employed, other mechanisms for removal of acid are possible, for instance by using tetraalkylammonium salts of volatile acids (eg. $CF_3CO_2^-$) or nucleophilic acids (eg $Br^-$), which respectively remove acid by volatilization out of the film during post-exposure bake or by reaction of a nucleophilic moiety with the acid precursor carbocation (e.g. reaction of tert-butyl carbocation with bromide to form t-butylbromide).

Figure 3:
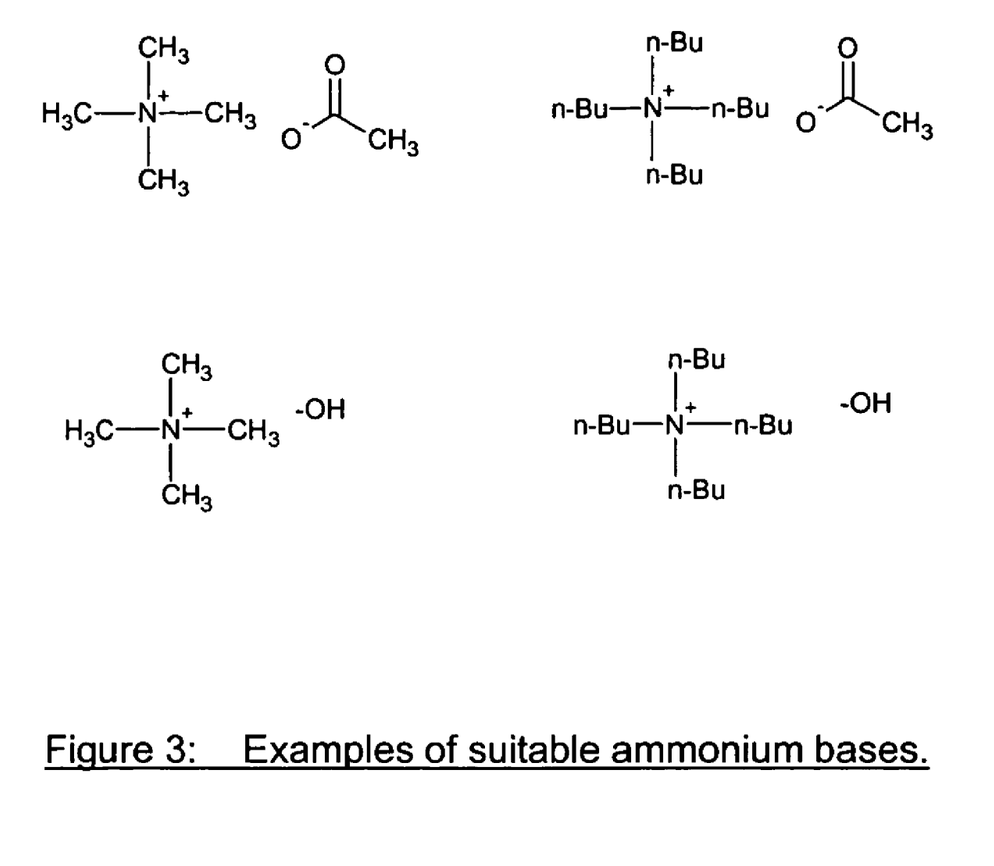
FIG. 3 illustrates examples of suitable ammonium bases which can be used in the photoresist.

FIG. 3 shows the structures of ammonium derivatives which might be employed as bases.

The use of non volatile amine additives is also possible. Preferred amines would be ones having a sterically hindered structure so as to hinder nucleophilic reactivity while maintaining basicity, low volatility and solubility in the resist formulation, such as a proton sponge, 1,5-diazabicyclo [4.3.0]-5-nonene, 1,8-diazabicyclo[5,4,0]-7-undecene, cyclic akylamines, or polyether bearing amines such as described in U.S. Pat. No. 6,274,286.

Furthermore, it is within the scope of this invention that the photoresist further comprises dissolution inhibitors. Typically, dissolution inhibitors are added to the photoresist to decrease the dissolution rate of the unexposed photoresist in the developer.

The photoresist composition is formed by blending the ingredients in a suitable photoresist solvent. In the preferred embodiment, the amount of polymer in the photoresist preferably ranges from 90% to about 99.5% and more preferably from about 95% to about 99% based on the weight of the solid; i.e., non-solvent photoresist components. In the preferred embodiment, the photoactive compound is present in the photoresist in an amount of from about 0.5% to about 10% preferably from about 4% to about 6% based on the weight of the solid photoresist components. In producing the photoresist composition, the solid components of the photoresist are mixed with a solvent or mixtures of solvents such as propylene glycol mono-alkyl ether, propylene glycol alkyl ether acetate, butyl acetate, xylene, 1,3-di(trifluoromethyl)benzene, ethylene glycol monoethyl ether acetate, propylene glycol mono-methyl ether acetate, 2-heptanone, ethyl lactate, ethyl-3-ethoxypropionate, and mixtures of ethyl lactate and ethyl-3-ethoxypropionate, among others.

The invention also relates to the novel monomer which when polymerized gives the novel polymer of the invention. The monomer comprises an aliphatic unsaturated moiety with a pendant structure (2)

where, as described previously, W is a nonaromatic linking group, R is independently selected from substituted hydrocarbyl group, unsubstituted hydrocarbyl group, hydrogen, hydroxyl, and $(C_1-C_{10})$alkyl, R' is hydrogen or $(C_1-C_6)$ alkyl, and n=1–9. The pendant group of structure 2 is pendant from an unsaturated aliphatic monomer which may be cyclic or linear, and when polymerized gives the moiety A of the novel polymer. The moiety A has been described previously in the present application.

The monomer may be synthesized by any known techniques. In one method the present momomers can be synthesized by reacting an acid of unsaturated alkyl or cycloalkyl compound, such as acrylic, methacrylic or norbornene carboxylic acid, with bromo acetyl-2-methyl-2-adamantyl in a solvent such as acetone or tetrahydrofuran, in presence of a base, such as triethylamine, trimethylamine, tetramenthyl ammonium hydroxide, potassium hydroxide or potassium bicarbonate. The reaction may be carried out at temperatures ranging from about 10° C. to about 100° C., preferably 20° C. to 60° C., more preferably 20° C. to 40° C., most preferably 22° C. to 26° C., and stirring for 2 to 6 hours, preferably 3 to 4 hours. The reactants may be dissolved in a suitable solvent, such as terahydrofuran. The product is isolated and purified according to known procedures The prepared photoresist composition solution can be applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over antireflective coatings.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) in thickness, remains on the substrate. In a preferred embodiment the temperature is from about 95° C. to about 160° C., and more preferably from about 95° C. to about 135° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. to about 160° C., more preferably from about 100° C. to about 130° C. The heating may be conducted for from about 30 seconds to about 5 minutes, more preferably from about 60 seconds to about 90 seconds on a hot plate or about 15 to about 45 minutes by convection oven.

The exposed photoresist-coated substrates are developed to remove the image-wise exposed areas by immersion in a developing solution or developed by spray, puddle or spray-puddle development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides or supercritical carbon dioxide. One preferred developer is an aqueous solution of tetramethyl ammonium hydroxide. Surfactants may also be added to the developer composition. After removal of the coated wafers from the developing solution, one may conduct an optional post-development heat treatment or bake to increase the coating's adhesion and chemical resistance to etching conditions and other substances. The post-development heat treatment can comprise the baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid etching solution or preferably, dry etching. In some cases metals are deposited over the imaged photoresist.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Example 1

Synthesis of 2-methyl-2-adamantyl Acetyl Norbornene Carboxylate (MAdoc ME)

Norbornene carboxylic acid (9.8 g) was taken into a 250 ml round bottom reaction flask, along with the bromo acetyl-2-methyl-2-adamantyl (10.0 g) and 100 ml of dry tetrahydrofuran (THF). The flask was stirred using an overhead stir motor driving a glass shaft with Teflon blade. It was mixed slowly until everything was dissolved in THF, yielding a clear uniform liquid. Then triethylamine (3.58 g,) was added drop wise. A large amount of white precipitate was formed. The mixture was allowed to mix overnight; the white solid was filtered and then washed with THF. The solid collected was discarded. The THF solution was drowned in ether (200–300 ml). The mixture was then washed with 5% HCl, 2×100 ml, and then washed with 5% $K_2CO_3$, 2×100 and water 2×100 ml. The organic phase was dried over $Na_2SO_4$, sodium sulphate was filterd and discarded and the filtrate was evaporated under vacuum. The reaction yielded 9.1 g (76% yield) of a viscous liquid which was 2-methyl-2-adamantyl acetyl Norbornene carboxylate (MAdoc ME). $^1$H NMR (Aceton-d6), 1.35 (m, 2H, norbornene) 1.6 (s, 3H, $CH_3$); 1.7–2.4 (m, norbornene and admantyl); 2.8–3.3 (m, norbornene); 4.55 (s, 2H, CH2); 5.95–6.2 (m, 2H, norbornene unsaturated proton).

Example 2

Poly(Norbornene MAdoc ME-co-β-methacryloyloxy-γ-butyolactone-co-2-methyladamantyl methacrylate-co-methacryloyloxy-norbornane-butyrolactone-co-maleic anhydride)

A hybrid copolymer was synthesized by reacting 8.16 g of norbornene MAdoc ME (10 mole %) from Example 1, 24.15 g of β-methacryloyloxy-γ-butyolactone (GBLMA, 30 mole %), 22.19 g of 2-methyladamantyl methacrylate (MAdMA, 40 mole %), 5.26 g of methacryloyloxy-norbornane-butyrolactone (MNBL, 10 mole %) and 2.32 g of maleic anhydride (MA) in the presence of 5 weight % of 2,2'azobisisobutyronitrile (AIBN) in tetrahydrofuran (THF) at 50% solid. The reaction was carried out for 7 hours and the polymer was isolated from diethyl ether twice (1/10 v/v ratio), giving a yield of 33.4 g (66.7%). The weight average molecular weight (Mw) as measured on a Gel Permeation Chromatograph (GPC) using polystyrene standards and THF solvent was 16,110.

Example 3

2.4646 g of polymer from example 2; 0.0416 g (30 μmol/g) of triphenylsulfonium nonafluorobutane sulfonate, 0.0416 g (30 μmol/g) of 4-methoxy-3,5-dimethyl phenyl dimethyl sulphonium nonaflate, 0.7149 g of 1 weight % PGMEA solution of N-(1-adamantyl acetamide) and 0.0371 g of 10 weight % PGMEA solution of a surfactant (fluoroaliphatic polymeric ester, supplied by 3M Corporation, St. Paul Minn.) were dissolved in 26.1588 g of PGMEA, and 0.5502 g of gamma valerolactone to give a 30 g photoresist solution.

Separately, a silicon substrate coated with a bottom anti-reflective coating (B.A.R.C.) was prepared by spin coating the bottom anti-reflective coating solution (AZ® EXP ArF-1 B.A.R.C. available from Clariant Corporation, Somerville, N.J.) onto the silicon substrate and baking at 175° C. for 60 sec. The B.A.R.C film thickness was 37 nm. The photoresist solution was then coated on the B.A.R.C coated silicon substrate. The spin speed was adjusted such that the photoresist film thickness was 240 nm. The photoresist film was baked at 115° C. for 90 sec. The substrate was then exposed in a 193 nm ISI ministepper (numerical aperture of 0.6 and coherence of 0.3/0.7, Annular Illumination). After exposure, the wafer was post-exposure baked at 130° C. for 90 sec. The imaged photoresist was then developed using a 2.38 weight % aqueous solution of tetramethyl ammonium hydroxide for 30 sec. The line and space patterns were then observed on a scanning electron microscope. The photoresist had a photosensitivity of 19 mJ/cm$^2$ and a linear resolution of 0.09 μm.

Example 4

Synthesis of 2-methyl-2-adamantyl acetyl-methacrylate (MAdocME Methacrylate)

Methacrylic acid 4.64 g (53.9 mmol) was placed into a 250 ml round bottom reaction flask, along with the bromoacetyl-2-methyl-2-adamantyl (15.47 g, 53.9 mmol) and 100 ml of dry THF. The flask was stirred using an overhead stir motor driving a glass shaft with Teflon blade. It was mixed slowly until everything was dissolved in THF, yielding a clear uniform liquid. Then triethylamine (6.55 g,) was added drop wise. A large amount of white precipitate was formed. The mixture was allowed to mix overnight, then the white solid was filtered and washed with THF. The solid collected was discarded. Ether (200–300 ml) was added and the mixture was then washed with 5% HCl, 2×100 ml, and then washed with 5% $K_2CO_3$, and water 2×100 ml. The ether phase was dried over $Na_2SO_4$, filtered and evaporated under vacuum to viscous oil, yielded 13.08 g of 2-methyl-2-adamantyl acetyl-methacrylate (MAdocME Methacrylate). $^1$H NMR (Aceton-d6): 1.6 (s, 3H, $CH_3$); 1.80 (s, 3H, $CH_3$); 1.7–2.7 (m, adamantyl); 4.7 (s, 2H, CH2); 5.7 and 6.2 (s, 2H, vinyl).

Example 5

Poly(MAdoc ME Methacrylate-co-β-methacryloyloxy-γ-butyolactone-co-methacryloyloxy-norbornane-butyrolactone)

A polymer was synthesized by reacting 12.0 g of MAdoc ME Methacrylate (40 mole %) from Example #4, 6.30 g of β-methacryloyloxy-γ-butyrolactone (GBLMA, 35 mole %), 5.84 g of methacryloyloxy-norbornane-butyrolactone (MNBL, 25 mole %) in the presence of 15 weight % of AIBN in tetrahydrofuran (THF) at 20% solid content. The reaction was carried out for 5 hours and the polymer was isolated twice from methanol (1/3 v/v ratio) and hexane (1/3 v/v ratio). The yield was 17 g (61%). The weight average molecular weight (Mw) as measured on a Gel Permeation Chromatograph (GPC) using polystyrene standards and THF solvent was 12,300.

Example 6

1.225 g of polymer from Example 5; 0.02 g (30 µmol/g) of triphenylsulfonium nonafluorobutane sulfonate, 0.018 g (30 µmol/g) of 4-methoxy-3,5-dimethyl phenyl dimethyl sulphonium nonaflate, 0.301 g of 1 weight % PGMEA solution of diisopropyamine (DIPA) and 0.017 g of 10 weight % PGMEA solution of a FC-4430.surfactant (fluoroaliphatic polymeric ester, supplied by 3M Corporation, St. Paul Minn.) were dissolved in 9.27 g of PGMEA, and 4.08 g of PGME to give a 15 g photoresist solution.

Separately, a silicon substrate coated with a bottom anti-reflective coating (B.A.R.C.) was prepared by spin coating the bottom anti-reflective coating solution (AZ® EXP ArF-1 B.A.R.C. available from Clariant Corporation, Somerville, N.J.) onto the silicon substrate and baking at 175° C. for 60 sec. The B.A.R.C film thickness was 37 nm. The photoresist solution was then coated on the B.A.R.C coated silicon substrate. The spin speed was adjusted such that the photoresist film thickness was 240 nm. The photoresist film was baked at 130° C. for 60 sec. The substrate was then exposed in a 193 nm ISI ministepper (numerical aperture of 0.6 and coherence of 0.42/0.7, Annular Illumination). After exposure, the wafer was post-exposure baked at 130° C. for 60 sec. The imaged photoresist was then developed using a 2.38 weight % aqueous solution of tetramethyl ammonium hydroxide for 60 sec. The line and space patterns were then observed on a scanning electron microscope. The photoresist had a photosensitivity of 25 mJ/cm$^2$ and a linear resolution of 0.11 µm.

Example 7

Synthesis of 2-methyl-2-adamantyl acetyl-decahydro-6 (or 7)-[(1-oxo-2-propyl)oxy]1,4;5,8-dimethanonaphthalene-2-carboxylate)

Decahydro-6 (or 7)-[(1-oxo-2-propyl)oxy]1,4;5,8-dimethanonaphthalene-2-carboxylic acid 20.0 g (0.072 mol) was taken into a 500 mL round bottom reaction flask, along with the bromoacetyl-2-methyl-2-adamantyl (20.1 g, 0.072 mol) and 200 mL of dry THF. The flask was stirred using an overhead stir motor driving a glass shaft with Teflon blade. It was mixed slowly until everything was dissolved in THF, yielding a clear uniform liquid. Then triethylamine (13.1 g) was added drop wise. A large amount of white precipitate was formed after one hour. The reaction was allowed to mix for 4 hours. The reaction mixture was poured into a 1000 ml separating funnel and Dl water was added. The reaction mixture was extracted with ether twice and the ether layer was washed with Dl water, potassium carbonate solution and water again. It was dried over sodium sulphate, filtered and the solvent was evaporated by rotovap, to yield 30 g of oily liquid of 2-methyl-2-adamantyl acetyl-decahydro-6 (or 7)-[(1-oxo-2-propy)oxy]1,4;5,8-dimethanonaphthalene-2-carboxylate (A-TCDCMAdoc).

Analysis by $^1$H NMR (Aceton-d6): 1.6 (s, 3H, CH$_3$); 1.7–2.7 (m, admantyl); 1.90–2.50 (m, dicyclic); 4.7 (s, 2H, CH2); 5.7 and 6.2 (s, s, 3H, vinyl).

Example 8

Poly(2-methyl-2-adamantylacetyl-decahydro-6(or 7)-[(1-oxo-2-propyl)oxy]1,4;5,8-dimethanonaphthalene-2-carboxylate-co-β-methacryloyloxy-γ-butyrolactone-co-hydroxyl adamantylmethacrylate)

A polymer was synthesized by reacting 22.2 g of 2-methyl-2-adamantylacetyl-decahydro-6(or 7)-[(1-oxo-2-propyl)oxy]1,4;5,8-dimethanonaphthalene-2-carboxylate (50 mole %) from Example # 7, 9.42 g of β-methacryloyloxy-γ-butyrolactone (GBLMA, 30 mole %), 4.36 g of hydroxyl adamantylmethacrylate (HADMA, 20 mole %) in the presence of 15 weight % of AIBN in tetrahydrofuran (THF) at 30% solid. The reaction was carried out for 5 hours and the polymer was isolated from methanol twice (1/3 v/v ratio) and hexane (1/3 v/v ratio), to yield 17 g, 61% of the polymer. The weight average molecular weight (Mw) as measured on a Gel Permeation Chromatograph (GPC) using polystyrene standards and THF solvent was, 11, 560.

Example 9

1.6437 g of polymer from Example 8; 0.0278 g (30 µmol/g) of triphenylsulfonium nonafluorobutane sulfonate, 0.0245 g (30 µmol/g) of 4-methoxy-3,5-dimethyl phenyl dimethyl sulphonium nonaflate_0.4022 g of 1 weight % PGMEA solution of DIPA and 0.024 g of 10 weight % PGMEA solution of a surfactant (fluoroaliphatic polymeric ester, supplied by 3M Corporation, St. Paul Minn.) were dissolved in 12.3879 g of PGMEA and 5.49 g of PGME to give a 20 g photoresist solution. Separately, a silicon substrate coated with a bottom antireflective coating (B.A.R.C.) was prepared by spin coating the bottom anti-reflective coating solution (AZ® EXP ArF-1 B.A.R.C. available from Clariant Corporation, Somerville, N.J.) onto the silicon substrate and baking at 175° C. for 60 sec. The B.A.R.C film thickness was 37 nm. The photoresist solution was then coated on the B.A.R.C coated silicon substrate. The spin speed was adjusted such that the photoresist film thickness was 240 nm. The photoresist film was baked at 130° C. for 60 sec. The substrate was then exposed in a 193 nm ISI mini stepper (numerical aperture of 0.6 and coherence of 0.42/0.7, Annular Illumination). After exposure, the wafer was post-exposure baked at 130° C. for 60 sec. The imaged photoresist was then developed using a 2.38 weight % aqueous solution of tetramethyl ammonium hydroxide for 60 sec. The line and space patterns were then observed on a scanning electron microscope. The photoresist had a photosensitivity of 25 mJ/cm$^2$ and a linear resolution of 0.11 µm.

What is claimed is:

1. A photoresist composition comprising a photoacid generator and a polymer comprising at least one unit derived from a cyclo olefin monomer and, at least one unit as described by structure 1, (1)

where, A has the structure (3)

where $R_1'$, $R_1''$ and $R_1'''$ are independently hydrogen, ($C_1$–$C_6$) alkyl or cyano, and Y is X, C(O)OX, OX, where X is an aliphatic ($C_1$–$C_6$) alkylene group, and m is 0 or 1,
W is a ($C_1$–$C_8$) linear or branched alkylene group,
R is independently selected from substituted hydrocarbyl group, unsubstituted hydrocarbyl group, hydrogen, hydroxyl, and ($C_1$–$C_{10}$)alkyl,
R' is hydrogen or ($C_1$–$C_6$) alkyl, and n=1–9.

2. The composition according to claim 1, where the polymer further comprises at least one comonomeric unit.

3. The composition according to claim 2, where the comonomeric unit is derived from monomers selected from cyclic anhydrides, (meth)acrylate esters, and vinyl acetals.

4. The process of imaging a positive photoresist composition comprising the steps of:
  a) coating a substrate with a film of photoresist composition of claim 1;
  b) baking the substrate to substantially remove the solvent;
  c) imagewise irradiating the photoresist film;
  d) baking the photoresist film; and,
  e) developing the irradiated photoresist film using an alkali developer.

5. The process according to claim 4, further comprising coating an antireflective film on the substrate prior to coating the photoresist.

6. The process according to claim 5, further where the antireflective coating is sensitive at 193nm.

7. The process of claim 4, wherein the photoresist film is imagewise irradiated with light of wavelength in the range of 100nm to 300nm.

8. The process of claim 4, wherein the heating in step d) ranges from a temperature of from about 90° C. to about 50° C. for from about 30 seconds to about 180 seconds on a hot plate.

9. The process of claim 4, wherein the alkali developer comprises an aqueous solution of tetramethyl ammonium hydroxide.

10. A polymer comprising at least one unit derived from a cyclo olefin monomer and, at least one unit as described by structure 1, (1)

where, A has the structure where $R_1'$, $R_1''$ and $R_1'''$ are independently hydrogen, ($C_1$–$C_6$) alkyl or cyano, and Y is X, C(O)OX, OX, where X is an aliphatic ($C_1$–$C_{10}$) alkylene group, and m is 0 or 1,
W is a ($C_1$–$C_8$) linear or branched alkylene group,
R is independently selected from substituted hydrocarbyl group, unsubstituted hydrocarbyl group, hydrogen, hydroxyl, and ($C_1$–$C_{10}$)alkyl,
R' is hydrogen or ($C_1$–$C_6$) alkyl, and n=1–9.

11. The composition of claim 1 where W is selected from methylene, methyl methylene, dimethyl methylene, isopropylene and propylene.

12. The composition of claim 1 where W is $CH_2$.

13. The composition of claim 10, where W is selected from methylene, methyl methylene, dimethyl methylene, isopropylene and propylene.

14. The composition of claim 10 where W is $CH_2$.

15. The composition of claim 1, where the unit of structure 1 is derived from a monomer of the structure:

16. The composition of claim 1, where the unit of structure 1 is derived from a monomer of the structure:

17. The composition of claim 1, where the cyclo olefin is a norbornene derivative.

18. The composition of claim 1, where the cyclo olefin monomer is selected from t-butyl norbornene carboxylate (BNC), hydroxyethyl norbornene carboxylate (HNC), norbornene carboxylic acid(NC), t-butyl tetracyclo[4.4.0.1.$^{2,6}$1.$^{7,10}$]dodec-8-ene-3-carboxylate, and t-butoxycarbonylmethyl tetracyclo[4.4.0.1.$^{2,6}$1.$^{7,10}$]dodec-8-ene-3-carboxylate.

19. The composition of claim 10, where the cyclo olefin is a norbornene derivative.

20. The composition of claim 10, where the cyclo olefin monomer is selected from t-butyl norbornene carboxylate (BNC), hydroxyethyl norbornene carboxylate (HNC), norbornene carboxylic acid(NC), t-butyl tetracyclo[4.4.0.1.$^{2,6}$1.$^{7,10}$]dodec-8-ene-3-carboxylate, and t-butoxycarbonylmethyl tetracyclo[4.4.0.1.$^{2,6}$1.$^{7,10}$] dodec-8-ene-3-carboxylate.

* * * * *